(12) United States Patent
Zhu et al.

(10) Patent No.: US 12,292,692 B2
(45) Date of Patent: May 6, 2025

(54) IMAGE STITCHING METHOD FOR STITCHING PRODUCT

(71) Applicant: Shanghai Huali Microelectronics Corporation, Shanghai (CN)

(72) Inventors: Xiaobin Zhu, Shanghai (CN); Haichang Zheng, Shanghai (CN); Lijun Chen, Shanghai (CN); Xiaolong Wang, Shanghai (CN); Yu Zhang, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 524 days.

(21) Appl. No.: 17/895,279

(22) Filed: Aug. 25, 2022

(65) Prior Publication Data

US 2023/0161939 A1    May 25, 2023

(30) Foreign Application Priority Data

Nov. 25, 2021   (CN) .......................... 202111409200.9

(51) Int. Cl.
| | | |
|---|---|---|
| *G03F 7/00* | (2006.01) | |
| *G03F 1/70* | (2012.01) | |
| *G06F 30/392* | (2020.01) | |
| *H10F 39/00* | (2025.01) | |

(52) U.S. Cl.
CPC ............ *G03F 7/70475* (2013.01); *G03F 1/70* (2013.01); *G06F 30/392* (2020.01); *H10F 39/011* (2025.01)

(58) Field of Classification Search
CPC ...... G03F 7/70475; G03F 1/70; G06F 30/392; H10F 39/011
See application file for complete search history.

(56) References Cited

U.S. PATENT DOCUMENTS

| | | | | |
|---|---|---|---|---|
| 9,507,271 | B1* | 11/2016 | Chen | .................... G03F 7/70275 |
| 2001/0041297 | A1* | 11/2001 | Nishi | ................... G03F 7/70733 |
| | | | | 430/22 |
| 2008/0208383 | A1* | 8/2008 | Dunham | ............. G03F 7/70475 |
| | | | | 700/121 |
| 2009/0276748 | A1* | 11/2009 | Leidy | .................. G03F 7/70475 |
| | | | | 716/122 |
| 2014/0145342 | A1* | 5/2014 | Schultz | ................. G03F 7/0035 |
| | | | | 257/773 |
| 2016/0306914 | A1* | 10/2016 | Kang | .................. G03F 7/70433 |

* cited by examiner

*Primary Examiner* — Stewart A Fraser
(74) *Attorney, Agent, or Firm* — Banner & Witcoff, Ltd.

(57) ABSTRACT

The present application discloses an image stitching method for a stitching product, which includes: step 1: providing a chip design layout of the stitching product; step 2: designing a mask layout according to the chip design layout, including: step 21: setting unit mask images; step 22: merging logic images or cutting path images of adjacent areas between unit regions together to set corresponding peripheral mask images; step 23: merging the same peripheral mask images into one; step 24: constituting a mask layer by using the unit mask images and each peripheral mask image, and forming the mask layout on a mask; step 3: performing repeated exposure to form the stitching product. The present application can reduce the number of mask images, the number of times of exposure and the time of exposure.

15 Claims, 3 Drawing Sheets

IMAGE STITCHING METHOD FOR STITCHING PRODUCT

CROSS-REFERENCES TO RELATED APPLICATIONS

This application claims the priority to Chinese patent application No. 202111409200.9, filed on Nov. 25, 2021, the disclosure of which is incorporated herein by reference in its entirety.

TECHNICAL FIELD

The present application relates to the field of semiconductor integrated circuit manufacturing, in particular to an image stitching method for a stitching product.

BACKGROUND

With the development of digital technology and semiconductor manufacturing technology, as well as the arrival of the information age, image sensors, as photoelectric components in the photoelectric industry, can be described as changing with each passing day. At present, it has been widely used in various fields, and each application has its unique customer system requirements. For example, some professional imaging applications such as astronomical telescopes, full-frame digital cameras and medical imaging require large-scale image sensors. These large-size image sensors have exceeded the image field of the lithography machine, and the maximum size of a single exposure is 26*33 mm. Therefore, stitching technology needs to be used in the manufacturing process.

Stitching technology, as the name suggests, is to partition the image involved in the chip manufacturing process, expose them in turn, and finally splice them into a large-size image sensor.

For image sensors such as CMOS image sensors (CIS), in the existing image stitching methods of the stitching product, a method for setting a mask image of the stitching product is that repeated exposure is adopted for the pixel region, and the surrounding cutting path and logic regions need to be exposed separately, so it is required to design multiple different images due to the complexity and changes of the logic region, which will cause more exposure times, thus slow down the exposure speed of the whole chip, and easily cause defects.

Referring to FIG. 1A, it is a chip design layer 101 in an existing image stitching method for a stitching product. Referring to FIG. 1B, it is a mask layout in the existing image stitching method for the stitching product. The existing image stitching method for the stitching product includes the following steps:

In step 1, referring to FIG. 1A, a chip design layout 101 of the stitching product is provided.

The chip design layout 101 is divided into unit regions and peripheral regions. Each unit region is formed by repeatedly arranging a plurality of unit circuit images 1031. In FIG. 1A, an area surrounded by a dashed box 102 represents a forming area of the unit region. A complete shot is an area shown by the chip design layout 101.

Logic regions and cutting paths are provided in the peripheral regions. Each logic region includes a logic image. Each cutting path includes a cutting path image.

Adjacent chips of the stitching product are isolated by the cutting paths.

In step 2, a mask layout is designed according to the chip design layout 101, including the following steps:

Referring to FIG. 1B, unit mask images 2021 for defining the unit circuit images 1031 are set.

Corresponding mask layouts are independently set on four sides and four corners of the chip design layout 101, including the following steps:

A peripheral mask image 2022 is independently set according to a repeated image 1032 in the peripheral region on the top side of the chip design layout 101.

A peripheral mask image 2024 is independently set according to a repeated image 1034 in the peripheral region on the bottom side of the chip design layout 101.

A peripheral mask image 2023 is independently set according to a repeated image 1033 in the peripheral region on the left side of the chip design layout 101.

A peripheral mask image 2025 is independently set according to a repeated image 1035 in the peripheral region on the right side of the chip design layout 101.

A peripheral mask image 2026 is independently set according to an image 1036 in the peripheral region at the left upper corner of the chip design layout 101.

A peripheral mask image 2027 is independently set according to an image 1037 in the peripheral region at the left lower corner of the chip design layout 101.

A peripheral mask image 2029 is independently set according to an image 1039 in the peripheral region at the right upper corner of the chip design layout 101.

A peripheral mask image 2028 is independently set according to an image 1038 in the peripheral region at the right lower corner of the chip design layout 101.

From FIG. 1B, it can be seen that a mask layout 201 includes the above nine mask images, and shading belts are located between the mask images.

In step 3, repeated exposure is performed to form the stitching product, including the following steps:

Repeated exposure is performed in the unit regions by adopting the unit mask images 2021 until all unit circuit images 1031 in the unit regions are defined on the chips.

Independent exposure is performed respectively to the peripheral regions on the four sides and at the four corners of the unit regions. This independent exposure method will maximize the number of times of exposure and delay the time of exposure of the entire stitching product.

BRIEF SUMMARY

According to some embodiments in this application, the present application is to provide an image stitching method for a stitching product, which can reduce the number of mask images, the number of times of exposure and the time of exposure.

The image stitching method for the stitching product provided by the present application includes the following steps:

step 1: providing a chip design layout of the stitching product and dividing the chip design layout into unit regions and peripheral regions, each unit region being formed by repeatedly arranging a plurality of unit circuit images;

logic regions and cutting paths being provided in the peripheral regions, each logic region including a logic image, and each cutting path including a cutting path image;

adjacent chips of the stitching product being isolated by the cutting paths;

step 2: designing a mask layout according to the chip design layout, including:

step 21: setting unit mask images for defining the unit circuit images;

step 22: merging the logic images or the cutting path images of adjacent areas between the unit regions together to set corresponding peripheral mask images;

step 23: comparing whether the peripheral mask images at symmetrical positions of the unit regions are the same, and merging the same peripheral mask images into one;

step 24: constituting a mask layer by using the unit mask images and each peripheral mask image, and forming the mask layout on a mask;

step 3: performing repeated exposure to form the stitching product, including:

performing repeated exposure in the unit regions by adopting the unit mask images until all unit circuit images in the unit regions are defined on the chips;

performing repeated exposure in the peripheral regions by adopting the corresponding peripheral mask images to form each logic image and each cutting path image on the chips, the exposed adjacent areas being not exposed any longer in a subsequent exposure process of the chip after each logic image and each cutting path image in the adjacent areas are defined on one of the chips in the adjacent areas between the unit regions of the adjacent chips.

In some cases, in step 1, a top view of each unit region is in the shape of a rectangle;

the rectangle of the unit region includes a first side, a second side, a third side and a fourth side, the first side and the third side are a pair of parallel opposite sides, and the second side and the fourth side are another pair of parallel opposite sides.

In some cases, each unit mask image is in the shape of a rectangle.

In some cases, in a parallel direction along the first side, a plurality of the unit regions are arranged adjacent, adjacent areas between the adjacent unit regions are first adjacent areas, and the logic images or the cutting path images in the first adjacent areas are merged together to set a first peripheral mask image.

In some cases, in a parallel direction along the second side, a plurality of the unit regions are arranged adjacent, adjacent areas between the adjacent unit regions are second adjacent areas, and the logic images or the cutting path images in the second adjacent areas are merged together to set a second peripheral mask image.

In some cases, four corners of each unit region have third adjacent areas formed by four adjacent unit regions; the logic images or the cutting path images in the third adjacent areas are merged together to set a third peripheral mask image.

In some cases, the first peripheral mask image is in the shape of a rectangle, and in the parallel direction along the second side, the size of the first peripheral mask image is the same as the size of the unit mask image.

In some cases, the second peripheral mask image is in the shape of a rectangle, and in the parallel direction along the first side, the size of the second peripheral mask image is the same as the size of the unit mask image.

In some cases, the third peripheral mask image is in the shape of a rectangle;

in the parallel direction along the first side, the size of the third peripheral mask image is the same as the size of the first peripheral mask image;

in the parallel direction along the second side, the size of the third peripheral mask image is the same as the size of the second peripheral mask image.

In some cases, area ranges of the unit mask image, the first peripheral mask image, the second peripheral mask image and the third peripheral mask image are all smaller than a single exposure range of a lithography machine; a forming area range of the chip is larger than the single exposure range of the lithography machine.

In some cases, the chip is a CMOS image sensor chip.

In some cases, the unit region is a pixel region and each unit of the unit region is a pixel unit.

In some cases, a mark image and a test key are provided on the cutting path.

In some cases, the mark image includes an alignment mark image or an overlay (OVL) mark image.

In some cases, in step 3, each chip is formed on a wafer.

In the present application, in the mask layout design, the cutting path images are placed inside the corresponding peripheral mask images, so that the peripheral mask images can be merged together to set according to the logic images or cutting path images in the adjacent areas between the adjacent unit regions of the adjacent chips. In this way, when the adjacent areas are exposed in the exposure process of a chip, they will not be exposed any longer in subsequent chips, thus reducing the number of mask images, reducing the number of times of exposure and the time of exposure, finally improving the delivery speed and effectively avoiding defects.

BRIEF DESCRIPTION OF THE DRAWINGS

The present application will be described in further detail below in combination with the specific embodiments with reference to the drawings.

DETAILED DESCRIPTION OF THE APPLICATION

Figure 2:
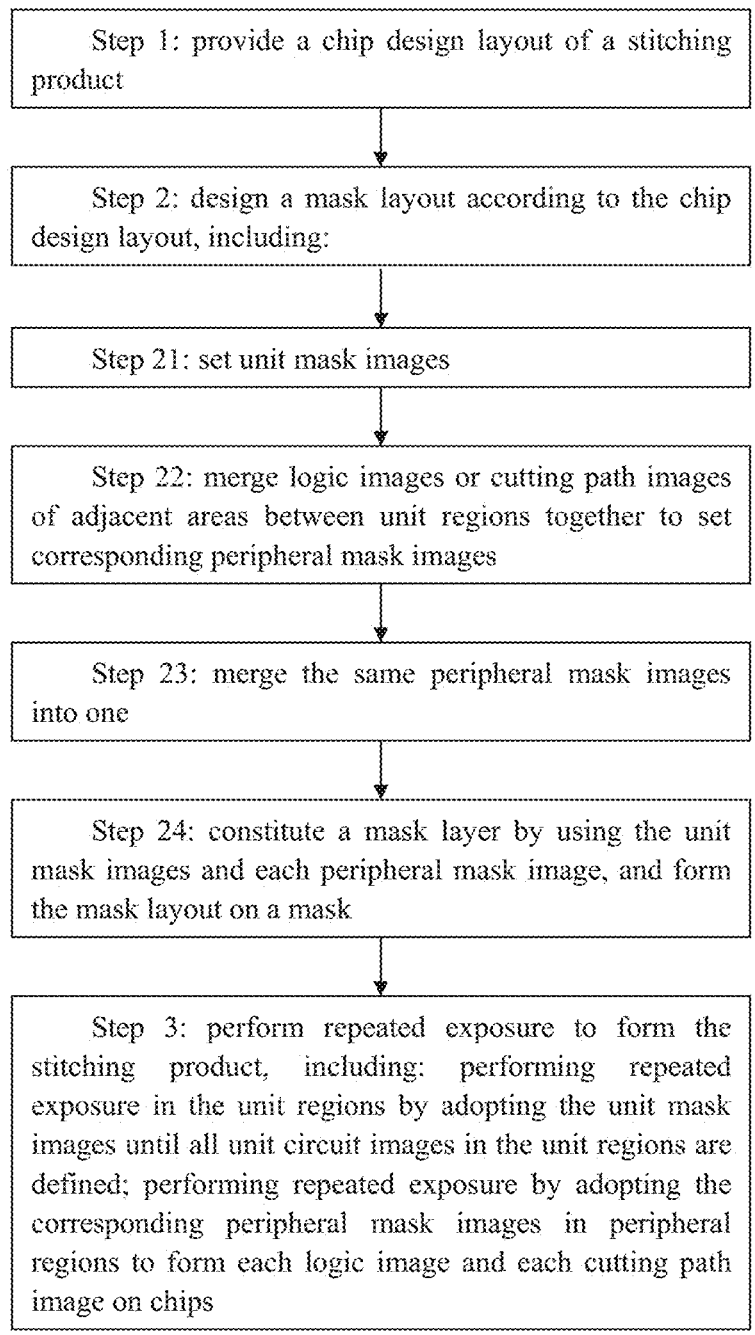
FIG. 2 illustrates a flowchart of an image stitching method for a stitching product according to an embodiment of the present application.
Figure 3A:
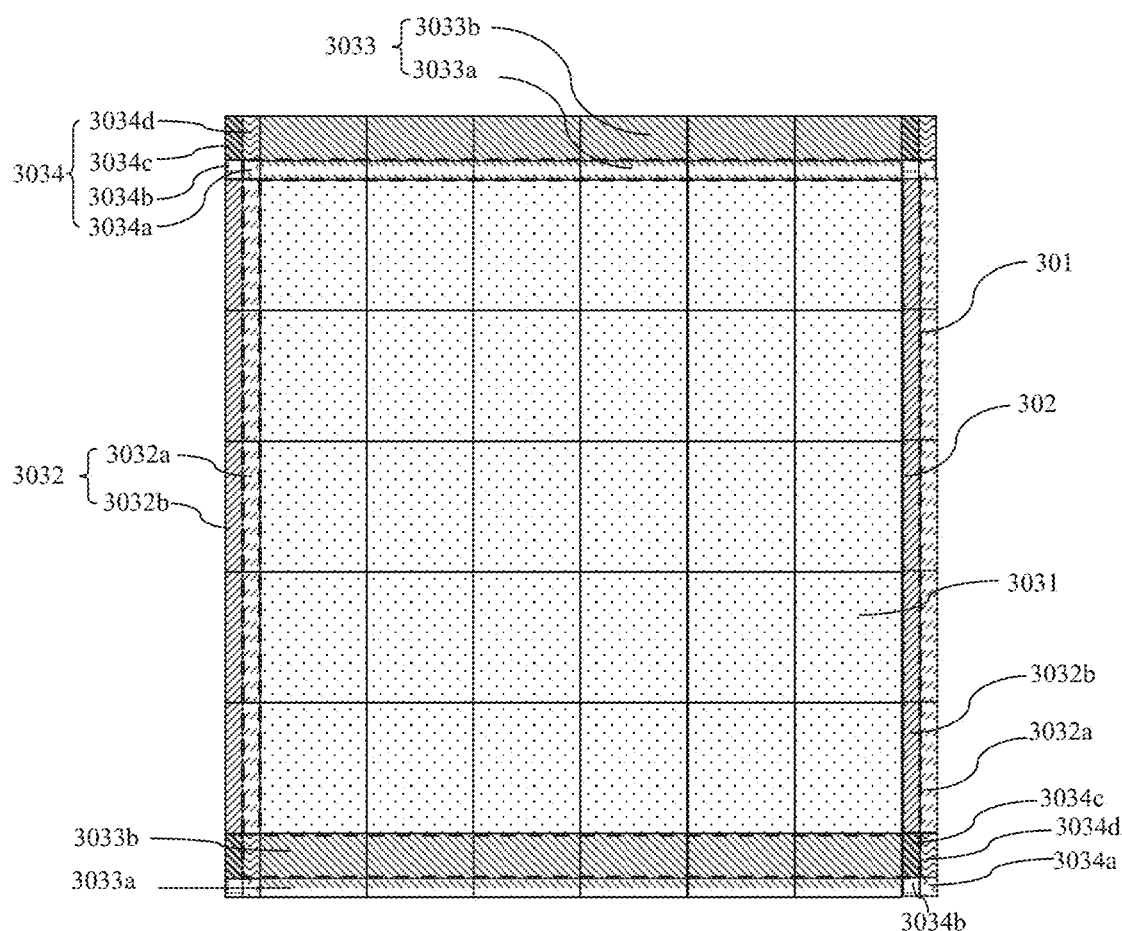
FIG. 3A illustrates a chip design layout in an image stitching method for a stitching product according to an embodiment of the present application.
Figure 3B:
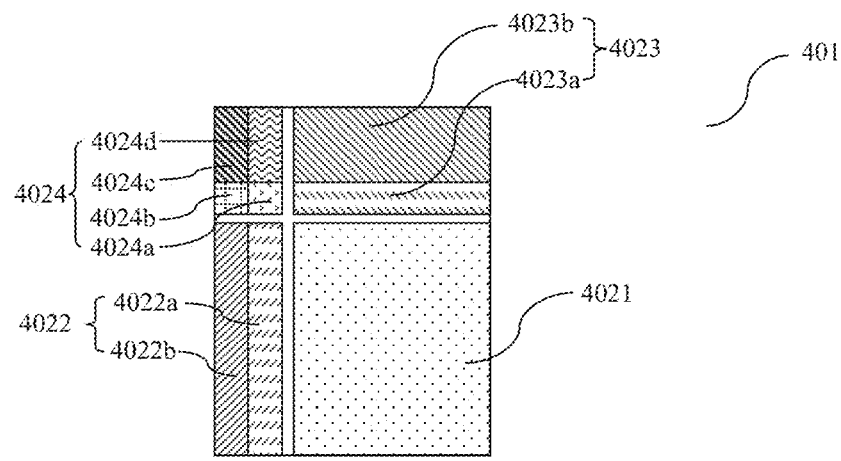
FIG. 3B illustrates a mask layout in an image stitching method for a stitching product according to an embodiment of the present application.

Referring to FIG. 2, it illustrates a flowchart of an image stitching method for a stitching product according to an embodiment of the present application. Referring to FIG. 3A, it illustrates a chip design layout in the image stitching method for the stitching product according to an embodiment of the present application. Referring to FIG. 3B, it illustrates a mask layout in the image stitching method for the stitching product according to an embodiment of the present application. The image stitching method for the stitching product according to an embodiment of the present application includes the following steps:

In step 1, referring to FIG. 3A, a chip design layout of the stitching product is provided. In FIG. 3A, an area surrounded by a dashed box 301 represents a forming area of the chip design layout.

The chip design layout is divided into unit regions and peripheral regions. Each unit region is formed by repeatedly arranging a plurality of unit circuit images 3031. In FIG. 3A, an area surrounded by a dashed box 302 represents a forming area of the unit region. The peripheral regions corresponding to one of the chips are located between the dashed box 301 and the dashed box 302.

Logic regions and cutting paths are provided in the peripheral regions. Each logic region includes a logic image and each cutting path includes a cutting path image.

Adjacent chips of the stitching product are isolated by the cutting paths.

In the embodiment of the present application, a top view of each unit region is in the shape of a rectangle.

The rectangle of the unit region includes a first side, a second side, a third side and a fourth side. The first side and the third side are a pair of parallel opposite sides. The second side and the fourth side are another pair of parallel opposite sides. In FIG. 3A, the first side is a top side of the unit region, the third side is a bottom side of the unit region, the second side is a left side of the unit region, and the fourth side is a right side of the unit region.

Each unit mask image 4021 is in the shape of a rectangle.

The chip is a CMOS image sensor chip.

The unit region is a pixel region. Each unit of the unit region is a pixel unit.

A mark image and a test key are provided on the cutting path.

The mark image includes an alignment mark image or an overlay mark image.

In step 2, a mask layout is designed according to the chip design layout, including the following steps:

In step 21, referring to FIG. 3B, unit mask images 4021 for defining the unit circuit images 3031 are defied.

In step 22, the logic images or the cutting path images of adjacent areas between the unit regions are merged together to set corresponding peripheral mask images.

In step 23, whether the peripheral mask images at symmetrical positions of the unit regions are the same is compared, and the same peripheral mask images are merged into one.

In step 24, a mask layer is constituted by using the unit mask images 4021 and each peripheral mask image, and the mask layout is formed on a mask.

In the embodiment of the present application, in a parallel direction along the first side, a plurality of the unit regions are arranged adjacent, adjacent areas between the adjacent unit regions are first adjacent areas, and the logic images or the cutting path images in the first adjacent areas are merged together to set a first peripheral mask image 4022.

In a parallel direction along the second side, a plurality of the unit regions are arranged adjacent, adjacent areas between the adjacent unit regions are second adjacent areas, and the logic images or the cutting path images in the second adjacent areas are merged together to set a second peripheral mask image 4023.

Four corners of each unit region have third adjacent areas formed by four adjacent unit regions; the logic images or the cutting path images in the third adjacent areas are merged together to set a third peripheral mask image 4024.

The first peripheral mask image 4022 is in the shape of a rectangle, and in the parallel direction along the second side, the size of the first peripheral mask image 4022 is the same as the size of the unit mask image 4021. The first peripheral mask image 4022 further includes mask sub-images 4022a and 4022b.

The second peripheral mask image 4023 is in the shape of a rectangle, and in the parallel direction along the first side, the size of the second peripheral mask image 4023 is the same as the size of the unit mask image 4021. The second peripheral mask image 4023 further includes mask sub-images 4023a and 4023b.

The third peripheral mask image 4024 is in the shape of a rectangle. In the parallel direction along the first side, the size of the third peripheral mask image 4024 is the same as the size of the first peripheral mask image 4022. In the parallel direction along the second side, the size of the third peripheral mask image 4024 is the same as the size of the second peripheral mask image 4023. The third peripheral mask image 4024 further includes mask sub-images 4024a, 4024b, 4024c, and 4024d.

Area ranges of the unit mask image 4021, the first peripheral mask image 4022, the second peripheral mask image 4023 and the third peripheral mask image 4024 are all smaller than a single exposure range of a lithography machine; a forming area range of the chip is larger than the single exposure range of the lithography machine.

Figure 1A:
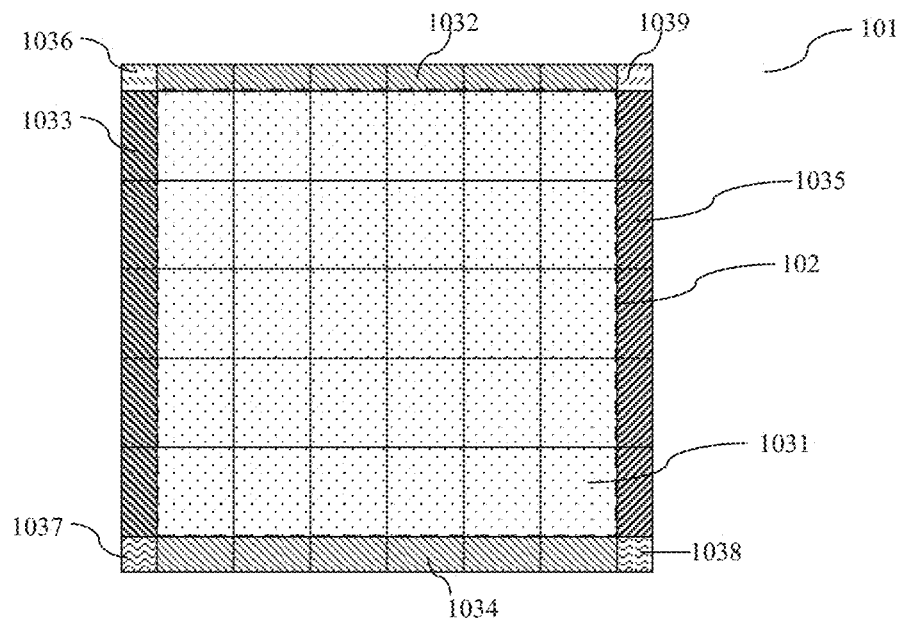
FIG. 1A illustrates a chip design layer in an existing image stitching method for a stitching product.
Figure 1B:
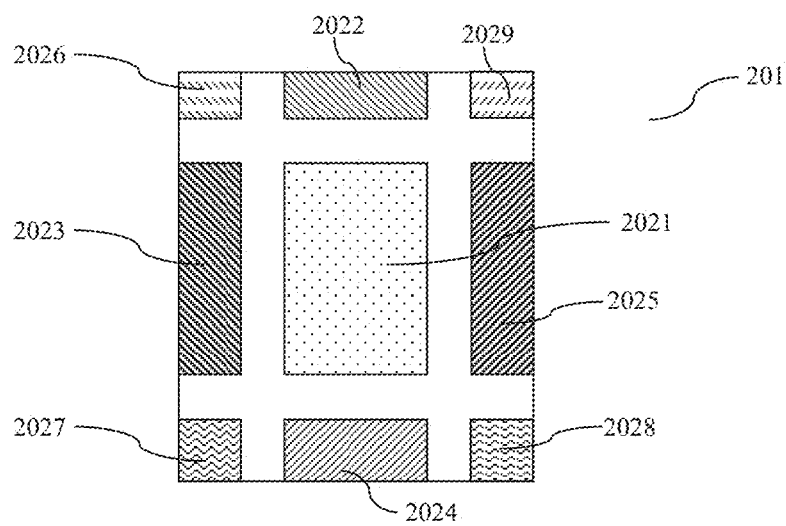
FIG. 1B illustrates a mask layout in the existing image stitching method for the stitching product.

From FIG. 3B, it can be seen that in the embodiment of the present application, only four mask images need to be used in the mask layout 401, while nine mask images need to be used in the mask layout 201 adopted in the existing method illustrated in FIG. 1B. Therefore, the embodiment of the present application can greatly reduce the number of mask images in the mask layout.

In step 3, repeated exposure is performed to form the stitching product, including the following steps:

Repeated exposure is performed in the unit regions by adopting the unit mask images 4021 until all unit circuit images 3031 in the unit regions are defined on the chips.

Repeated exposure is performed in the peripheral regions by adopting the corresponding peripheral mask images to form each logic image and each cutting path image on the chips. The exposed adjacent areas are not exposed any longer in a subsequent exposure process of the chip after each logic image and each cutting path image in the adjacent areas are defined on one of the chips in the adjacent areas between the unit regions of the adjacent chips.

Each chip is formed on a wafer. After exposure, each mask image of the mask layout 401 is transferred to the wafer and the layout of the chip is formed. The layout actually formed on the chip is consistent with the chip design layout 301 illustrated in FIG. 3A. The exposure process of the actual layout of the chip will be described in detail by using the chip design layout 301 as follows.

The unit circuit image 3031 in the unit region is formed through repeated exposure by using the unit mask image 4021.

The first adjacent area on the left side of the unit region and the first adjacent area on the right side of the unit region are formed through repeated exposure by using the first peripheral mask image 4022. The image 3032 is an image formed through one exposure by using the first peripheral mask image 4022. The image 3032 is further divided into sub-images 3032a and 3032b, which are defined by the mask sub-images 4022a and 4022b respectively. It can be seen that within the range of the dashed box 301, only the sub-image 3032a on the left side and the sub-image 3032b on the right side are included. The sub-image 3032b on the left side will belong to the chip on the left side of the current chip, and the sub-image 3032a on the right side will belong to the chip on the right side of the current chip. Accordingly, it can be seen that the embodiment of the present application directly realizes the seamless stitching of multiple chips. In this way, on average, for one of the chip, the left and right sides of the unit region actually only need exposure of one of the first adjacent areas, thus greatly reducing the number of times of exposure.

The second adjacent area on the top side and the second adjacent area on the bottom side of the unit region are formed through repeated exposure by using the second peripheral mask image 4023. The image 3033 is an image formed through one exposure by using the second peripheral mask image 4023. The image 3033 is further divided into sub-images 3033a and 3033b, which are defined by the mask sub-images 4023a and 4023b respectively. Accordingly, it can be seen that within the range of the dashed box 301, only the sub-image 3033a on the top side and the sub-image 3033b on the bottom side are included. The sub-image 3033b on the top side will belong to the chip on the top side of the current chip, and the sub-image 3033a on the bottom side will belong to the chip on the bottom side of the current chip. Similarly, for one of the chips, the top and bottom sides of the unit region actually only need exposure of one of the second adjacent areas, thus greatly reducing the number of times of exposure.

The four corners of the unit region are formed through repeated exposure by using the third peripheral mask image 4024. The image 3034 is an image formed through one exposure by using the third peripheral mask image 4024. The image 3034 is further divided into sub-images 3034a, 3034b, 3034c and 3034d, which are defined by the mask sub-images 4024a, 4024b, 4024c and 4024d respectively. Accordingly, it can be seen that within the range of the dashed box 301, only the sub-image 3034a at the upper left corner, the sub-image 3034d at the lower left corner, the sub-image 3034b at the upper right corner and the sub-image 3034c at the lower right corner are included. Other sub-images of the images 3034 at the four corners of the current chip belong to the corresponding adjacent chips. Similarly, for one of the chips, two sides of each of the four corners of the unit region only need exposure of one of the third adjacent areas, thus greatly reducing the number of times of exposure.

In the embodiment of the present application, in the mask layout design, the cutting path images are placed inside the corresponding peripheral mask images, so that the peripheral mask images can be merged together to set according to the logic images or cutting path images in the adjacent areas between the adjacent unit regions of the adjacent chips. In this way, when the adjacent areas are exposed in the exposure process of a chip, they will not be exposed any longer in subsequent chips, thus reducing the number of mask images, reducing the number of times of exposure and the time of exposure, finally improving the delivery speed and effectively avoiding defects.

By changing the existing method, the embodiment of the present application places the cutting paths inside the images, that is, the mask images, and then all the external images can be seamlessly stitched with each other. Different images that originally had to be exposed individually can be merged together, thus greatly reducing the number of images, thereby effectively reducing the number of times of exposure, the time of exposure, defects, hidden hazards and the like.

The experiment shows that for a first stitching CIS product with pixels of 24 million and shot size of 38 mm*39 mm, in the existing method, the number of the mask images of the mask layout is 6, the number of times of exposure of a single wafer is 475, the time of exposure required to complete the exposure of all stitching products on a single wafer is 180 s, and the Wafers Per Hour (WPH) is 18.88. As a comparison, in the method according to the embodiment of the present application, the number of the mask images of the mask layout is 4, the number of times of exposure of a single wafer is 401, the time of exposure of a single wafer is 86 s, and the WPH is 36.9.

Similarly, for a second stitching CIS product with pixels of 225 million and shot size of 119 mm*121 mm. In the existing method, the number of the mask images of the mask layout is 9, the number of times of exposure of a single wafer is 305, the time of exposure of a single wafer is 149 s, and the WPH is 22.4. As a comparison, in the method according to the embodiment of the present application, the number of the mask images of the mask layout is 4, the number of times of exposure of a single wafer is 235, the time of exposure of a single wafer is 71 s, and the WPH is 44.

It can be seen from the above two experiments that the embodiment of the present application can increase the output by about 100%.

The present application has been described in detail through the specific embodiments, which, however, do not constitute limitations to the present application. Without departing from the principle of the present application, those skilled in the art may also make many modifications and improvements, which should also be considered as included in the scope of protection of the present application.

What is claimed is:

1. An image stitching method for a stitching product, comprising:
    step 1: providing a chip design layout of the stitching product and dividing the chip design layout into unit regions and peripheral regions, each unit region being formed by repeatedly arranging a plurality of unit circuit images,
    logic regions and cutting paths being provided in the peripheral regions, each logic region comprising a logic image, and each cutting path comprising a cutting path image,
    adjacent chips of the stitching product being isolated by the cutting paths;
    step 2: designing a mask layout according to the chip design layout, comprising:
    step 21: setting unit mask images for defining the unit circuit images;
    step 22: merging the logic images or cutting path images of adjacent areas between the unit regions together to set corresponding peripheral mask images;
    step 23: comparing whether the peripheral mask images at symmetrical positions of the unit regions are the same, and merging same peripheral mask images into one; and
    step 24: constituting a mask layer by using the unit mask images and each peripheral mask image, and forming the mask layout on a mask; and
    step 3: performing repeated exposure to form the stitching product, comprising:
    performing repeated exposure in the unit regions by adopting the unit mask images until all unit circuit images in the unit regions are defined on the chips; and
    performing repeated exposure in the peripheral regions by adopting the corresponding peripheral mask images to form each logic image and each cutting path image on the chips, exposed adjacent areas being not exposed any longer in a subsequent exposure process of the chip after each logic image and each cutting path image in the adjacent areas are defined on one of the chips in the adjacent areas between the unit regions of the adjacent chips.

2. The image stitching method for the stitching product according to claim 1, wherein, in step 1, a top view of each unit region is in a shape of a rectangle; and
the rectangle of the unit region comprises a first side, a second side, a third side, and a fourth side, the first side and the third side are a pair of parallel opposite sides, and the second side and the fourth side are another pair of parallel opposite sides.

3. The image stitching method for the stitching product according to claim 2, wherein each unit mask image is in the shape of a rectangle.

4. The image stitching method for the stitching product according to claim 3, wherein, in a parallel direction along the first side, a plurality of the unit regions are arranged adjacent, adjacent areas between the adjacent unit regions are first adjacent areas, and the logic images or the cutting path images in the first adjacent areas are merged together to set a first peripheral mask image.

5. The image stitching method for the stitching product according to claim 4, wherein, in a parallel direction along the second side, a plurality of the unit regions are arranged adjacent, adjacent areas between the adjacent unit regions are second adjacent areas, and the logic images or the cutting path images in the second adjacent areas are merged together to set a second peripheral mask image.

6. The image stitching method for the stitching product according to claim 5, wherein four corners of each unit region have third adjacent areas formed by four adjacent unit regions, and the logic images or the cutting path images in the third adjacent areas are merged together to set a third peripheral mask image.

7. The image stitching method for the stitching product according to claim 6, wherein the first peripheral mask image is in the shape of a rectangle, and in the parallel direction along the second side, a size of the first peripheral mask image is the same as a size of the unit mask image.

8. The image stitching method for the stitching product according to claim 7, wherein the second peripheral mask image is in the shape of a rectangle, and in the parallel direction along the first side, a size of the second peripheral mask image is the same as the size of the unit mask image.

9. The image stitching method for the stitching product according to claim 8, wherein the third peripheral mask image is in the shape of a rectangle,
in the parallel direction along the first side, a size of the third peripheral mask image is the same as the size of the first peripheral mask image, and
in the parallel direction along the second side, the size of the third peripheral mask image is the same as the size of the second peripheral mask image.

10. The image stitching method for the stitching product according to claim 9, wherein area ranges of the unit mask image, the first peripheral mask image, the second peripheral mask image, and the third peripheral mask image are all smaller than a single exposure range of a lithography machine, and
a forming area range of the chip is larger than the single exposure range of the lithography machine.

11. The image stitching method for the stitching product according to claim 1, wherein the chip is a CMOS image sensor chip.

12. The image stitching method for the stitching product according to claim 11, wherein the unit region is a pixel region and each unit of the unit region is a pixel unit.

13. The image stitching method for the stitching product according to claim 11, wherein a mark image and a test key are provided on the cutting path.

14. The image stitching method for the stitching product according to claim 13, wherein the mark image comprises an alignment mark image or an overlay mark image.

15. The image stitching method for the stitching product according to claim 13, wherein, in step 3, each chip is formed on a wafer.

* * * * *